(12) United States Patent
Nakashima

(10) Patent No.: US 7,268,434 B2
(45) Date of Patent: Sep. 11, 2007

(54) SEMICONDUCTOR DEVICE AND METHOD OF MANUFACTURING THE SAME

(75) Inventor: Yuichi Nakashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 11/397,707

(22) Filed: Apr. 5, 2006

(65) Prior Publication Data

US 2007/0032067 A1 Feb. 8, 2007

(30) Foreign Application Priority Data

Jul. 27, 2005 (JP) .............................. 2005-217685

(51) Int. Cl.
*H01L 23/48* (2006.01)
*H01L 21/4763* (2006.01)

(52) U.S. Cl. ...................... 257/774; 257/773; 257/775; 438/638; 438/668

(58) Field of Classification Search ................ 257/750, 257/751, 752, 753, 773, 774, 775; 438/622, 438/637, 638, 666, 668
See application file for complete search history.

(56) References Cited

U.S. PATENT DOCUMENTS

| 6,027,994 | A * | 2/2000 | Huang et al. ................ 438/618 |
| 6,093,656 | A * | 7/2000 | Lin .............................. 438/734 |
| 6,184,126 | B1 * | 2/2001 | Lee et al. ..................... 438/637 |
| 6,376,351 | B1 * | 4/2002 | Tsai ............................. 438/592 |
| 6,812,130 | B1 * | 11/2004 | Brase .......................... 438/623 |
| 6,887,802 | B2 * | 5/2005 | Narita et al. ................. 257/774 |
| 6,995,073 | B2 * | 2/2006 | Liou ............................ 257/774 |
| 2004/0102031 | A1 * | 5/2004 | Kloster et al. .............. 438/619 |
| 2005/0106852 | A1 * | 5/2005 | Park et al. ................... 438/619 |
| 2005/0202667 | A1 * | 9/2005 | Cohen et al. ............... 438/622 |
| 2006/0057842 | A1 * | 3/2006 | Wang .......................... 438/637 |
| 2006/0088995 | A1 * | 4/2006 | Zhang et al. ............... 438/627 |

FOREIGN PATENT DOCUMENTS

JP    2002-76129    3/2002

* cited by examiner

*Primary Examiner*—Kevin M. Picardat
(74) *Attorney, Agent, or Firm*—Finnegan, Henderson, Farabow, Garrett & Dunner, L.L.P.

(57) ABSTRACT

There is disclosed a semiconductor device comprising at least one first insulating film provided above a substrate, being formed with at least one first recess having a first width, and being formed with at least one second recess having a second width which is 1/x (x: positive numbers larger than 1) a size of the first width and having a same depth as the first recess, a second insulating film provided at both sides of the first recess and at a lower part of the second recess, and a conductor provided inside of the second insulating films provided at the both sides of the first recess with extending from an opening of the first recess to a bottom surface thereof, and provided with extending from an opening of the second recess to an upper surface of the second insulating film provided at the lower part of the second recess.

18 Claims, 7 Drawing Sheets

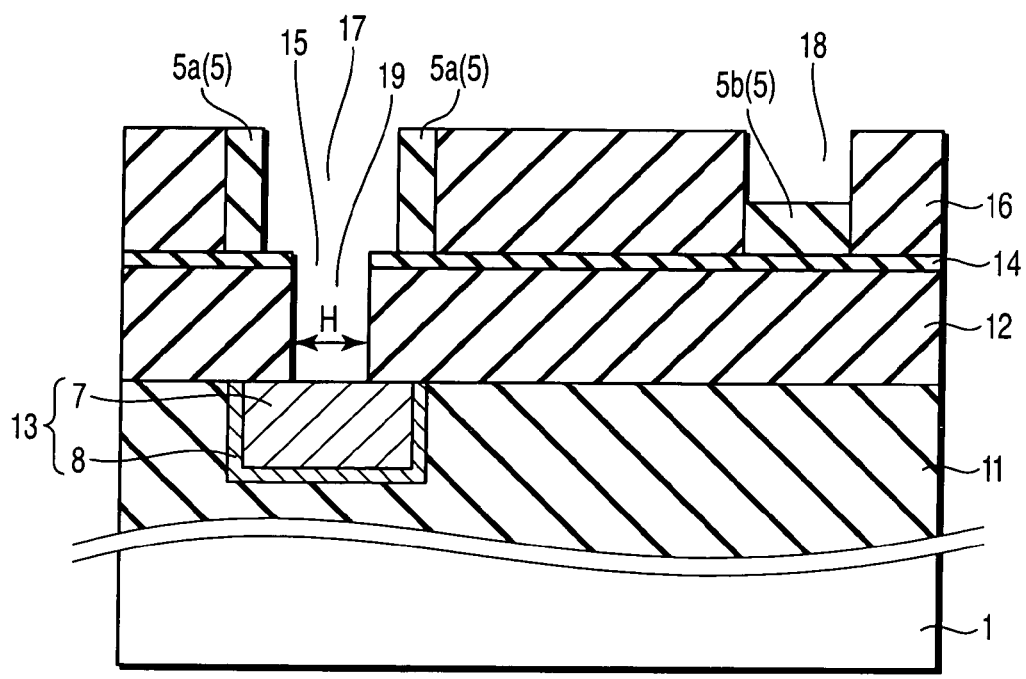
F I G. 9
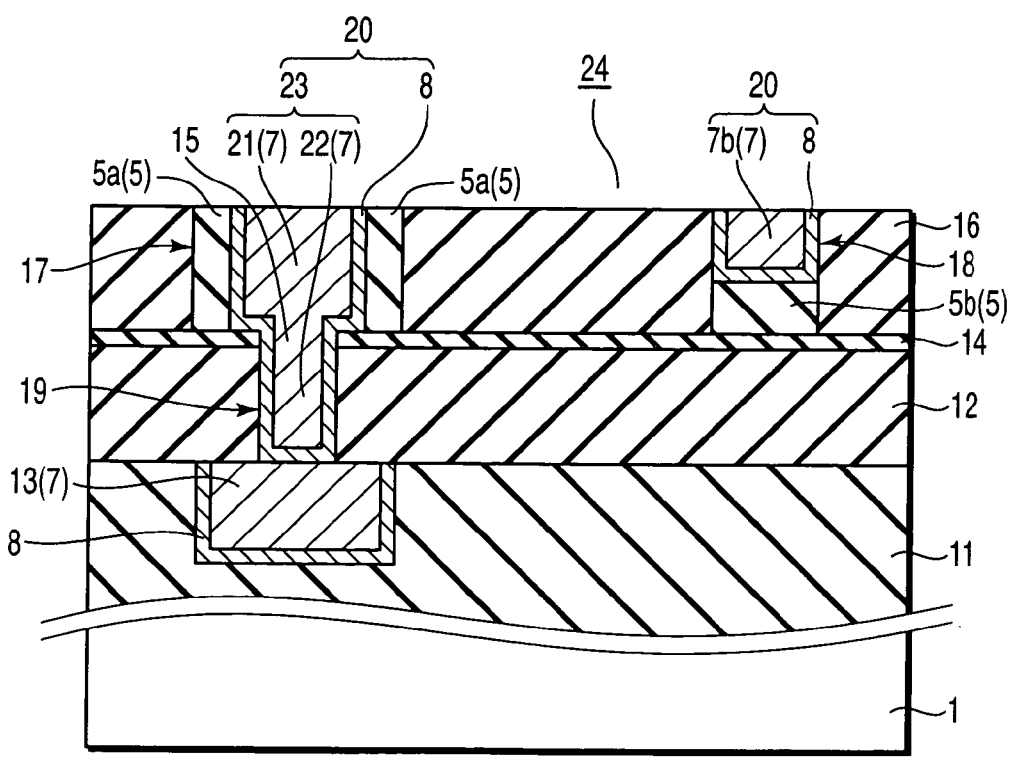
F I G. 10

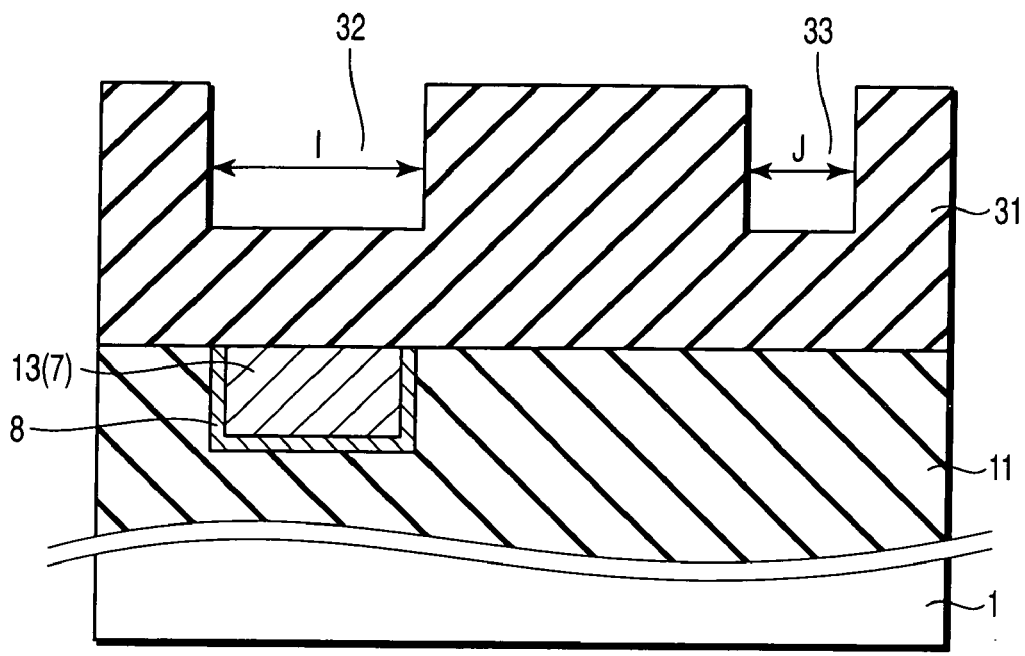
F I G. 11
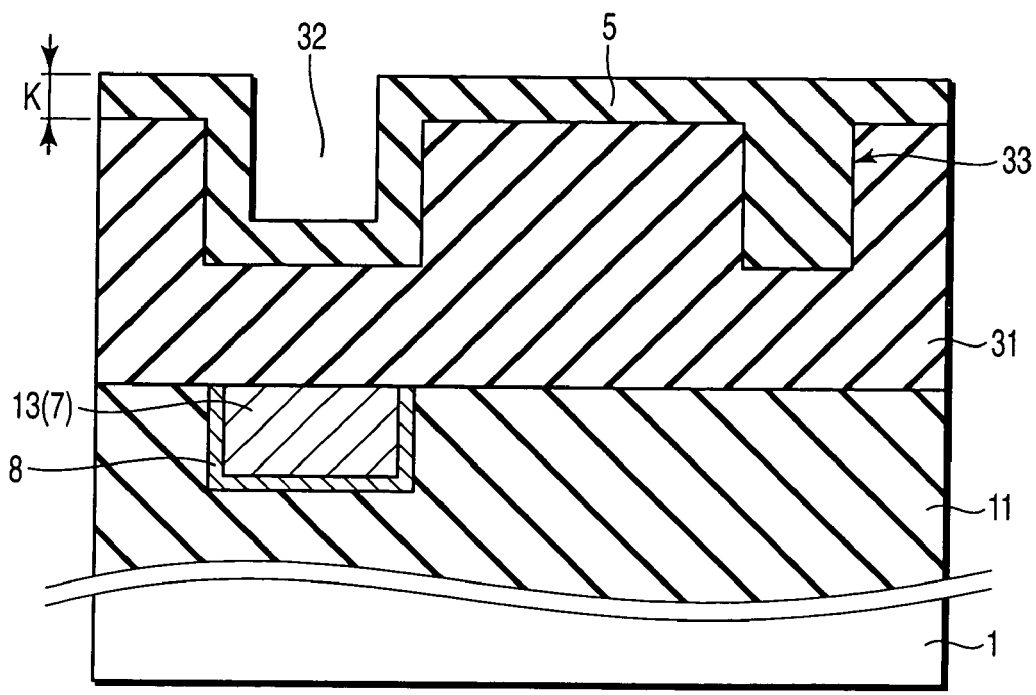
F I G. 12

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2005-217685, filed Jul. 27, 2005, the entire contents of which are incorporated herein by reference.

BACKGROUND OF THE INVENTION

1. Field of the Invention

The present invention relates to a technique of forming interconnects of a semiconductor device. In particular, the present invention relates to a semiconductor device, which is provided with several interconnects having different thickness in the same layer, and to a method of manufacturing the same device.

2. Description of the Related Art

Recently, it is general that interconnects provided in a semiconductor device are formed using a burying process calling a damascene process. Of these interconnects provided in the semiconductor device, a fuse interconnect exists in addition to an interconnect provided as an ordinary conducting path. The fuse interconnect is provided for the purpose of breaking a conducting path with failure circuits, for example. It is preferable that ordinary interconnects are formed thicker to reduce the interconnect resistance. On the contrary, it is preferable that the fuse interconnect is formed thin because it is hard to be blown if formed thick.

According to an ordinary damascene process, if several interconnects are formed in an interlayer insulating film of the same layer, it is general that the following process is carried out. Specifically, in order to improve work efficiency, several trenches for providing the foregoing interconnects are collectively formed via one-time etching process. Of course, if the interlayer insulating film is formed of a single material, trenches formed via one-time etching process all have the approximately same depth. For this reason, according to the ordinary damascene process, it is difficult to form the foregoing several interconnects having different thickness in the interlayer insulating film of the same layer. If several trenches having different depth are formed in the interlayer insulating film of the same layer using the ordinary damascene process, the etching process increases; as a result, work efficiency is reduced. The foregoing technique is disclosed in JPN. PAT. APPLN. KOKAI Publication No. 2002-76129, for example.

BRIEF SUMMARY OF THE INVENTION

According to an aspect of the invention, there is provided a semiconductor device comprising: at least one first insulating film provided above a substrate, being formed with at least one first recess having a first width, and being formed with at least one second recess having a second width which is 1/x (x: positive numbers larger than 1) a size of the first width and having a same depth as the first recess; a second insulating film provided at both sides of the first recess and at a lower part of the second recess; and a conductor provided inside of the second insulating films provided at the both sides of the first recess with extending from an opening of the first recess to a bottom surface thereof, and provided in the second recess with extending from an opening of the second recess to an upper surface of the second insulating film provided at the lower part of the second recess.

According to another aspect of the invention, there is provided a method of manufacturing a semiconductor device comprising: forming a first recess having a first width, and a second recess having a second width which is 1/x (x: positive numbers larger than 1) a size of the first width and having a same depth as the first recess in at least one layer of a first insulating film at least one by one respectively; providing a second insulating film until its thickness coming up to ½x a size of the first width with covering a surface of the first insulating film being formed with the first and second recesses; anisotropically removing the second insulating film provided on the surface of the first insulating film mainly along a thickness direction thereof until the bottom of the first recess is exposed with leaving the second insulating film at both sides of the first recess; and providing a conductor in each of the first and second recesses.

According to yet another aspect of the invention, there is provided a method of manufacturing a semiconductor device comprising: providing a first insulating film of an n-th layer (n: 2 or more integers) on a first insulating film of an (n−1)th layer provided above a substrate and being formed with at least one lower-layer conductor; providing a third insulating film having processing selectivity smaller than that of the first insulating film on the first insulating film of the n-th layer, and forming at least one through hole through the third insulating film along a thickness direction thereof above at least one the lower-layer conductor; providing a first insulating film of an (n+1)th layer with covering a surface of the third insulating film and a surface of the first insulating film of the n-th layer being exposed via the through hole, and forming at least one first recess having a first width larger than a diameter of the through hole through the first insulating film of the (n+1)th layer along a thickness direction thereof above the through hole, and forming at least one second recess having a second width which is 1/x (x: positive numbers larger than 1) a size of the first width through the first insulating film of the (n+1)th layer along a thickness direction thereof at a position off above the through hole; providing a second insulating film until its thickness coming up to ½x a size of the first width with covering a surface of the first insulating film of the (n+1)th layer being formed with the first and second recesses, and the surface of the third insulating film and the surface of the first insulating film of the n-th layer being exposed via the first recess; anisotropically removing the second insulating film provided on the surface of the first insulating film of the (n+1)th layer mainly along a thickness direction thereof until at least the surface of the third insulating film below the first recess is exposed with leaving the second insulating film at both sides of the first recess; forming at least one third recess through the first insulating film of the n-th layer along a thickness direction thereof below the through hole, which communicates with the first recess via the through hole and exposes a surface of the lower-layer conductor below the through hole; and providing an upper-layer conductor in each of the first, second, and third recesses.

According to still another aspect of the invention, there is provided a method of manufacturing a semiconductor device comprising: providing a first insulating film of an n-th layer (n: 2 or more integers) on a first insulating film of an (n−1)th layer provided above a substrate and being formed with at least one lower-layer conductor; forming at least one first recess having a first width in the first insulating film of the n-th layer above at least one the lower-layer conductor, and forming at least one second recess having a second width which is 1/x (x: positive numbers larger than 1) a size of the first width and having a same depth as the first recess in the first insulating film of the n-th layer at a position different from a part formed the first recess; providing a second insulating film until its thickness coming up to ½x a size of the first width with covering a surface of the first insulating film of the n-th layer being formed with the first and second recesses; anisotropically removing the second insulating film provided on the surface of the first insulating film of the n-th layer mainly along a thickness direction thereof until the bottom of the first recess is exposed with leaving the second insulating film at both sides of the first recess; forming a third recess communicating with a lower part of the first recess and exposing a surface of the lower-layer conductor, which through the resist film and the first insulating film of the n-th layer along the thickness direction thereof above the lower-layer conductor and inside the second insulating film left at the both sides of the first recess, after providing a resist film inside each of the first and second recesses and on the surface of the first insulating film of the n-th layer; and providing an upper-layer conductor in each of the first, second, and third recesses, after removing the resist film on the surface of the first insulating film of the n-th layer being formed with the third recess and each inside of the first and second recesses.

BRIEF DESCRIPTION OF THE SEVERAL VIEWS OF THE DRAWING

FIG. 9 is a cross-sectional view to explain the process of manufacturing a semiconductor device according to a second embodiment;

FIG. 10 is a cross-sectional view showing a semiconductor device according to a second embodiment of the present invention;

FIG. 11 is a cross-sectional view to explain the process of manufacturing a semiconductor device according to a third embodiment of the present invention;

FIG. 12 is a cross-sectional view to explain the process of manufacturing a semiconductor device according to a third embodiment;

DETAILED DESCRIPTION OF THE INVENTION

Embodiments of the present invention will be described below with reference to the accompanying drawings.

First Embodiment

Figure 1:
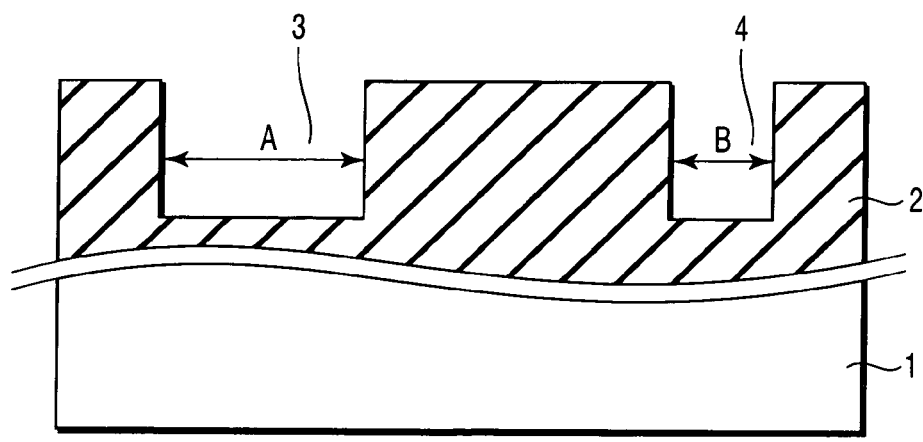
FIG. 1 is a cross-sectional view to explain the process of manufacturing a semiconductor device according to a first embodiment of the present invention.
Figure 2:
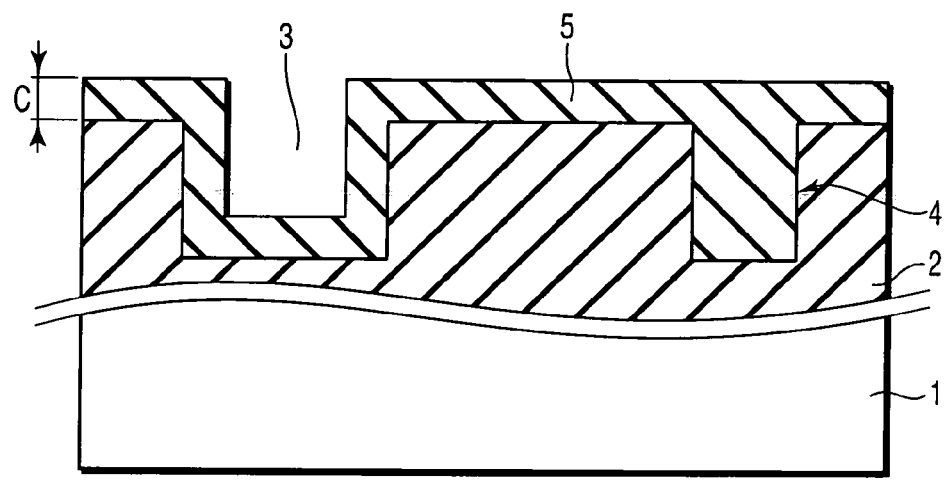
FIG. 2 is a cross-sectional view to explain the process of manufacturing a semiconductor device according to a first embodiment.
Figure 3:
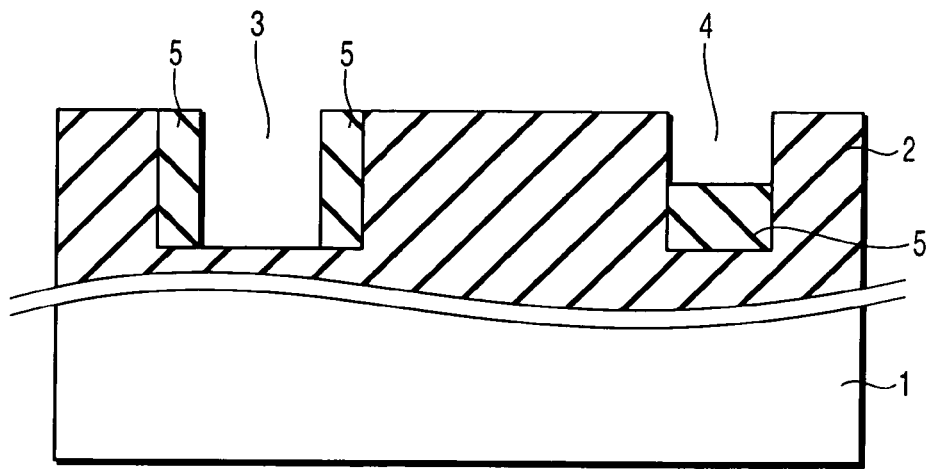
FIG. 3 is a cross-sectional view to explain the process of manufacturing a semiconductor device according to a first embodiment.
Figure 4:
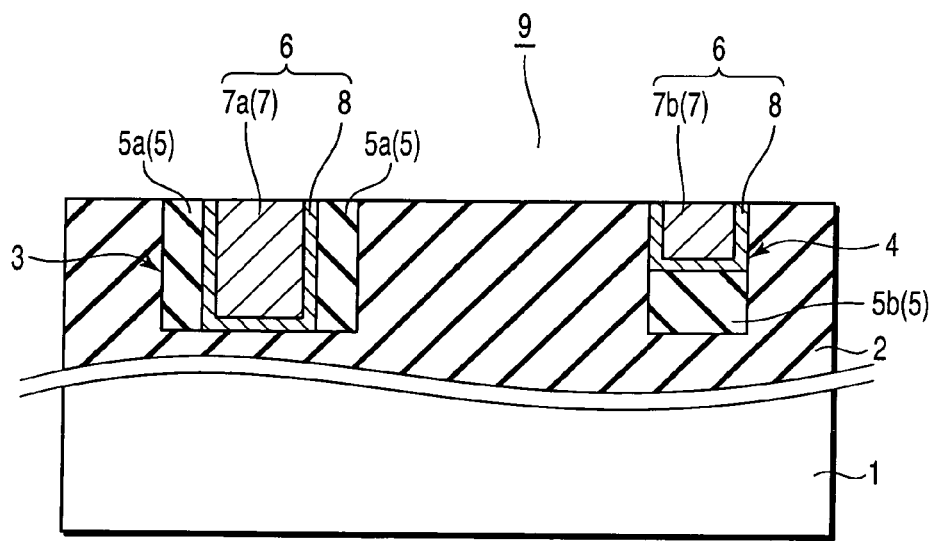
FIG. 4 is a cross-sectional view showing a semiconductor device according to a first embodiment of the present invention.

The first embodiment of the present invention will be explained below with reference to FIG. 1 to FIG. 4. FIG. 1 to FIG. 3 is a cross-sectional view to explain the process of manufacturing a semiconductor device according to the first embodiment. FIG. 4 is a cross-sectional view showing a semiconductor device according to the first embodiment.

The first embodiment relates to a technique of effectively and readily forming several interconnects having different film thickness in the same insulating film. Specifically, the first embodiment relates to a process of forming interconnects using a so-called damascene process (burying process). In particular, the first embodiment relates to a damascene interconnect formation process. According to the damascene interconnect formation process, a damascene fuse interconnect having different thickness and other damascene interconnects are effectively and readily formed in the same insulating film in a fuse interconnect formation process. The explanation will be detailedly given below.

As shown in FIG. 1, a predetermined layer above a semiconductor substrate 1 such as silicon wafer is provided with at least one interlayer insulating film 2 as a first insulating film. Although not illustrated, the surface layer of the semiconductor substrate 1 are provided with various semiconductor devices, electronic circuits and conductive layers (conductor) such as substrate wires. The semiconductor devices include active elements (active region) such as transistor and passive elements (passive region) such as capacitor. In the following description, one interlayer insulating film 2 shown in FIG. 1 to FIG. 4 is provided in the uppermost layer of several layers above the semiconductor substrate 1.

For example, the interlayer insulating film 2 is provided using a coating process. In this case, various insulating films are used as the interlayer insulating film 2 in accordance with the specifications of a desired semiconductor device. For example, general insulating films such as $SiO_2$ film and TEOS film, or so-called low dielectric-constant insulating film (low-k film) are used. The following films are given as the low-k film used for the interlayer insulating film 2. For example, MSQ (methyl-polysiloxane) low-k film or PAE (polyallylene ether) low-k film is given. More specifically, the following films may be used as the low-k film used for the interlayer insulating film 2. For example, siloxane-based films, films consisting of mainly organic resin or porous films such as porous silica film are used. The foregoing siloxane-based films include polysiloxane, hydrogen siloces-xyoxane, polymethyl siloxane and methyl siloces-xyoxane. The foregoing films consisting of mainly organic resin include polyallylene ether, polybenzo oxazole and polybenzo cyclobutane.

As depicted in FIG. 1, lithography process and etching process such as RIE are carried out to form first and second recesses 3 and 4 at least one by one on the surface layer of the interlayer insulating film 2. In this case, a width A of the first recess (first trench) 3 shown in FIG. 1 is set to an ordinary size conformable to a general design rule. Thus, the first recess 3 is also called as an ordinary trench. On the other hand, a width B of the second recess (second trench) 4 shown in FIG. 1 is set to an about 1/x size of the first width A, that is, second width. In this case, x is positive numbers larger than 1. In other words, the second width B is smaller than the first width A. Therefore, the second recess 4 is formed in its width narrower than the first recess 3. In the following description, the width (second width) B of the second recess 4 is set to about ½ of the width (first width) A of the first recess 3. Moreover, the first and second recesses 3 and 4 are formed having the approximately same depth. Specifically, the first and second recesses 3 and 4 are each set to a predetermined depth such that they do not penetrate through the interlayer insulating film 2 along the thickness direction. According to the foregoing setting, the second recess 4 is formed having an aspect ratio higher than the first recess 3.

As described later, the first recess 3 is an ordinary interconnect formation recess (ordinary interconnect formation trench) for providing an ordinary interconnect 7a. The ordinary interconnect 7a forms a conducting path of various circuits (not shown) provided in a semiconductor device 9 according to the first embodiment. On the other hand, the second recess 4 is a fuse interconnect formation recess (fuse interconnect formation trench) for electrically cutting off failure circuit (not shown) occurring in the semiconductor device 9 from non-defective (normal) circuits.

As illustrated in FIG. 2, a second insulating film 5 independent from the interlayer insulating film (first insulating film) 2 is formed to cover the film 2 formed with first and second recesses 3 and 4. The second insulating film 5 is provided using CVD process, for example. In this case, a thickness C of the second insulating film 5 shown in FIG. 2 is set to about ½x of the first width A. According to the foregoing setting, the second insulating film 5 is deposited on the surface of the film 2 until the thickness C becomes about ¼ of the width (first width) A of the first recess 3. Thus, as seen from FIG. 2, the second insulating film 5 is deposited in the lower part (bottom) and side of the first recess 3 until the thickness becomes about ¼ of the first width A. By doing so, the first recess 3 is not fully filled with the second insulating film 5. On the contrary, the second recess 4 is fully filled with the second insulating film 5. This is because the second insulating film 5 is deposited on each surface of the inside and bottom of the first and second recesses 3 and 4 to have uniform thickness.

Like the interlayer insulating film 2, various insulating films are used as the second insulating film 5 in accordance with the specifications of a desired semiconductor device. For example, general insulating films such as $SiO_2$ film and TEOS film, or so-called low dielectric-constant insulating film (low-k film) are used. As described later, the second insulating film 5 functions as a protect film for preventing a conductor 6 provided in the first and second recesses 3 and 4 from deteriorating. Specifically, the second insulating film 5 functions as an anti-oxidation or anti-diffusion film. The anti-oxidation film prevents a conductor 6 provided in the first and second recesses 3 and 4 from being oxidized. The anti-diffusion film prevents the component of the conductor 6 from diffusing in the interlayer insulating film 2.

As seen from FIG. 3, the second insulating film 5 is left on the inside of the first recess 3. Simultaneously, the film 5 provided on the surface of the interlayer insulating film 2 is anisotropically removed along the thickness direction until the bottom surface of the first recess 3 coated with the film 5 is exposed. In this case, anisotropic etching such as dry etching is sued as means for anisotropically removing the second insulating film 5. The foregoing etching process is carried out, and thereby, the surface of the interlayer insulating film 2 forming the bottom (lower part) of the first recess 3 is exposed. In addition, the second insulating film 5 having an about ¼ thickness of the first width A is left on each of right and left insides of the first recess 3. As a result, the first recess 3 substantially has an about ½ width of the first width A before the second insulating film 5 is provide therein. In other words, the first recess 3 provided with the second insulating films 5 at the right and left insides has the approximately same as the width (second width) of the second recess 4. In this case, the depth of the first recess 3 is the same as the depth before the second insulating film 5 is provide therein, as is evident from FIG. 3.

On the other hand, the foregoing etching process is carried out, and thereby, the second insulating film 5 is removed in the second recess 4 over a range from the opening part to intermediate part along the depth direction. As a result, the second insulating film 5 is left in the lower part (bottom) of the second recess 4. Therefore, after the foregoing etching is completed, the second recess 4 has a depth substantially shallower than the first recess 3. Namely, the second recess 4 has the approximately same width as the first recess 3 provided with the second insulating films 5 at the right and left insides, and has a bottom shallower than the first recess 3.

As shown in FIG. 4, a conductor 6 is provided (filled) in the first recess 3 having the second insulating film 2 left at its both insides and in the second recess 4 having the film 5 left on the bottom. The conductor 6 is composed of two conductors, that is, first conductor 7 functioning as an interconnect and second conductor 8 functioning as a barrier metal film. Specifically, the barrier metal film 8 having a predetermined thickness is provided to cover the following parts. The parts include the bottom of the first recess 3, the inside of the second recess 4, the surface of the second insulating film 5 left in each of the recesses 3 and 4 and the surface of the interlayer insulating film 2. The barrier metal film 8 is provided using CVD process. For example, TaN film 8 is used as the barrier metal film. Then, ordinary interconnect 7a and fuse interconnect 7b (described later), that is, Cu film 7 is provided to cover the surface of the TaN film 8. The Cu film 7 is provided so that each of the first and second recesses 3 and 4 coated with the TaN film 8 is fully filled. Moreover, the Cu film 7 is provided using a so-called Cu plating such as electroplating and electroless plating.

Unnecessary Cu film 7 and TaN film 8 are removed, and thereby, Cu film 7 and TaN film 8 are left in the first and second recesses 3 and 4 only. Specifically, Cu film 7 and TaN film 8 on the interlayer insulating film 2 are polished and removed using CMP (Cu CMP process). By doing so, Cu film 7 and TaN film 8 are filled in each of the first and second recesses 3 and 4 where the second insulating film 5 is left, as shown in FIG. 4.

As a result, Cu film 7 and TaN film 8 are left in the inside of the second insulating film 5 provided in both sides of the first recess 3 over the range from the opening to the bottom of the first recess 3, as seen from FIG. 4. Simultaneously, Cu film 7 and TaN film 8 are left over the range from the opening of the second recess 4 to the upper surface of the second insulating film 5 provided on the lower part of the second recess 2. As is evident from FIG. 4, the Cu film 7 (i.e., Cu interconnect 7b) is formed thinner than the Cu film 7 (i.e., Cu interconnect 7a) provided in the first recess 3. Thus, according to the first embodiment, at least two Cu interconnects 7a and 7b having the approximately same width and different thickness are concurrently provided in the interlayer insulating film 2 of the same layer via the same process.

Thereafter, a predetermined process is carried out, and thereby, it is possible to obtain a semiconductor device 9 of the first embodiment having a desired interconnection structure shown in FIG. 4. Specifically, the semiconductor device 9 has the interconnection structure in which thicker Cu interconnect 7a and thinner Cu interconnect 7b are provided at least one by one in the interlayer insulating film 2 of the same layer. In this case, the thicker Cu interconnect 7a has an about ½ width of the first width shown in FIG. 1, and is coated with the second insulating film 5 at its both sides. The thinner Cu interconnect 7b has an about ½ width of the first width, that is, second width B, and is coated with the second insulating film 5 at the bottom.

In general, if the interconnect has a large cross section, the electric resistance (interconnect resistance) becomes small. Thus, the electric resistance of ordinary interconnects forming the conducting path of various circuits provided in the semiconductor device becomes small, and thereby, the operating speed of these various circuits becomes high. This serves to improve the performance of the semiconductor device. Therefore, it is preferable that the ordinary interconnect provided in the semiconductor device is formed to have a large cross section as much as possible. Moreover, it is general that the interconnect is easy to be broken if the cross section becomes small. For example, in the semiconductor device, fuse interconnect is used to electrically cut off failure circuit occurring therein from non-defective circuit. The fuse interconnect is easy to be blown by laser beam if the cross section becomes small. Usually, the fuse interconnect is easy to be blown if the cross section becomes small. Preferably, the fuse interconnect provided in the semiconductor device is formed having a smaller cross section as much as possible.

Here, based on the design rule, the width of the interconnect provided in the semiconductor device is uniquely set to a predetermine size regardless of the use of interconnect. In this case, the interconnect must be formed thicker as much as possible in order to make large the cross section of the interconnect. Conversely, the interconnect must be formed thinner as much as possible in order to make small the cross section of the interconnect. However, it is preferable that the interconnect provided in the semiconductor device is formed thicker as much as possible, resulting from the foregoing reason. Conversely, it is preferable that the fuse interconnect provided in the semiconductor device is formed thinner as much as possible.

According to the first embodiment, at least two Cu interconnects 7a and 7b having the approximately same width and different thickness are provided in the interlayer insulating film 2 of the same layer. Specifically, as shown in FIG. 4, at least one first recess 3 formed in the interlayer insulating film 2 is provided with the thicker Cu interconnect 7a coated with the TaN film 8. Moreover, at least one second recess 4 is formed in the interlayer insulating film 2 of the same layer as the layer formed with the first recess 3. In addition, the second recess 4 is provided with the thinner Cu interconnect 7b coated with the TaN film 8. Therefore, according to the first embodiment, the thicker Cu interconnect 7a provided in the first recess 3 is used as an ordinary interconnect comprising interconnect body only. On the other hand, the thinner Cu interconnect 7b provided in the second recess 4 is used as a fuse interconnect comprising interconnect body only.

Moreover, as depicted in FIG. 4, both sides (right and left sidewalls) of the first recess, that is, ordinary interconnect formation recess 3 is provided with the second insulating film 5. In this case, the film 5 is independent from the interlayer insulating film 2, and has the same height as the ordinary interconnect 7a. The second insulating film 5 provided in the ordinary interconnect formation recess 3 functions as an anti-oxidation or anti-diffusion film. The anti-oxidation film prevents the ordinary interconnect (interconnect body) 7a from being oxidized. The anti-diffusion film prevents the component of the ordinary interconnect 7a from diffusing in the interlayer insulating film 2. In other words, the second insulating film 5 provided in the ordinary interconnect formation recess 3 functions as an ordinary interconnect protect film 5a for preventing the quality of the ordinary interconnect 7a from reducing.

Likewise, the lower part (bottom) of the second recess, that is, fuse interconnect formation recess 4 is provided with the second insulating film 5. In this case, the film 5 is independent from the interlayer insulating film 2, and has the same width as the fuse interconnect 7b. The second insulating film 5 provided in the fuse interconnect formation recess 4 functions as an anti-oxidation or anti-diffusion film, like the ordinary interconnect protect film 5a. The anti-oxidation film prevents the fuse interconnect (fuse interconnect body) 7b from being oxidized. The anti-diffusion film prevents the component of the fuse interconnect 7b from diffusing in the interlayer insulating film 2. In other words, the second insulating film 5 provided in the fuse interconnect formation recess 4 functions as an ordinary interconnect protect film 5a for preventing the quality of the fuse interconnect 7b from reducing.

Figure 5:
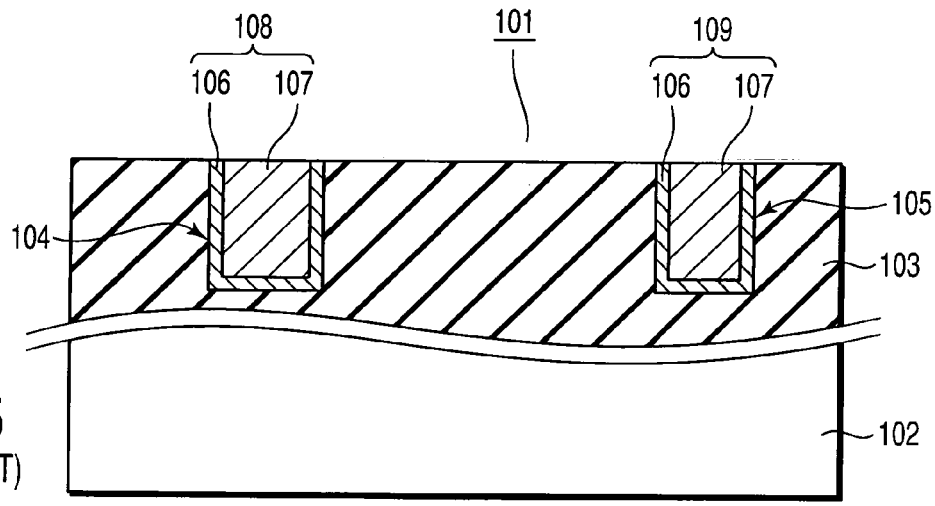
FIG. 5 is a cross-sectional view showing a semiconductor device according to the prior art given as a comparative example with respect to the semiconductor device according to the first embodiment shown in FIG. 4.

Referring now to FIG. 5, a comparative example with respect to the first embodiment will be explained below. FIG. 5 is a cross-sectional view showing a semiconductor device 101 according to the prior art given as a comparative example with respect to the semiconductor device 9 according to the first embodiment shown in FIG. 4. The process of manufacturing the semiconductor device 101 will be briefly explained below.

First, one interlayer insulating film 103 is provided in a predetermined layer above a semiconductor substrate 102 via the same process as the method of manufacturing the semiconductor device 9. The interlayer insulating film 103 is etched to form first and second recesses 104 and 105 having the same depth at least one by one. However, the specific correlation in width between the first and second recesses 104 and 105 is not given, unlike the foregoing method of manufacturing the semiconductor device 9. Then, barrier metal film, that is, TaN film 106 and interconnect, that is, Cu film 107 are successively stacked on the surface of the interlayer insulating film 103 formed with first and second recesses 104 and 105. However, in this case, the following process described in the foregoing method of manufacturing the semiconductor device 9 is not carried out. That is, an insulating film different from the interlayer insulating film 103 is left in first and second recesses 104 and 105 before barrier metal film 106 and Cu film 107 are provided on the surface of the film 103. Then, CMP process is carried out to fill barrier metal film 106 and Cu film 107 in the first and second recesses 104 and 105. As a result, first and second interconnects 108 and 109 each comprising TaN film 106 and cu film 107 are formed one by one in the interlayer insulating film 103.

The first and second interconnects 108 and 109 formed using the conventional damascene process each have the same thickness, unlike the foregoing ordinary interconnect 7a and fuse interconnect 7b included in the semiconductor 9 of the first embodiment. As described before, if the ordinary interconnect is formed in the semiconductor device, it is preferable that the interconnect is formed thicker to reduce the interconnect resistance. Conversely, if the fuse interconnect is formed in the semiconductor device, it is preferable that the interconnect is formed thinner to be readily blown. However, according to the conventional damascene process, it is almost impossible to concurrently form interconnects 108 and 109 having mutually different thickness in the interlayer insulating film 103 of the same layer via the same process. In other words, the conventional damascene process is employed, and thereby, the following disadvantage is given. In order to form ordinary and fuse interconnects in the interlayer insulating film 103 of the same layer without increasing the number of processes, any one of ordinary and fuse interconnects must be inevitably matched with the thickness of the other interconnects.

As described before, the ordinary interconnect is usually formed thicker than the fuse interconnect. Therefore, if the fuse interconnect is formed having the same thickness as the ordinary interconnect, the fuse interconnect is hard to be blown. Conversely, if the ordinary interconnect is formed having the same thickness as the fuse interconnect, the interconnect resistance becomes large. In any cases, it is difficult to expect improvement of the quality and performance in the conventional semiconductor device 101 including ordinary and fuse interconnects having the same thickness. In addition, it is difficult to improve the yield of the semiconductor device 101. Moreover, if ordinary and fuse interconnects are formed in the interlayer insulating film 103 of the same layer using the conventional damascene process, the number of processes inevitably increases. As a result, it is difficult to improve the production efficiency of the semiconductor device. Thus, according to the conventional method of manufacturing the semiconductor device, it is difficult to improve both the quality and performance of the semiconductor device and the production efficiency thereof.

On the contrary, according to the method of manufacturing the semiconductor device of this embodiment, the following advantage is given. That is, thick ordinary interconnect 7a and thin fuse interconnect 7b are concurrently provided in the interlayer insulating film 2 of the same layer via the same damascene process. In other words, ordinary and fuse interconnects 7a and 7b having different thickness are readily and effectively provided in the interlayer insulating film 2 of the same layer.

As described above, according to the first embodiment, it is possible to readily and effectively manufacture the semiconductor device 9 including several interconnects 7 having different thickness existing in the interlayer insulating film 2 of the same layer. In other words, the ordinary interconnect 7a reducing the interconnect resistance and the fuse interconnect 7b easy to be blown are provided at least one by one in the interlayer insulating film 2 of the same layer. Therefore, it is possible to readily and effectively manufacture the semiconductor device 9, which can improve its performance, quality, yield and production efficiency. Moreover, both sides of the ordinary interconnect 7a is coated with the ordinary interconnect protect film 5a while the lower part of the fuse interconnect 7b is coated with the fuse interconnect protect film 5b. Therefore, these ordinary and fuse interconnects 7a and 7b are hard to be deteriorated. In other words, the performance and quality of these ordinary and fuse interconnects 7a and 7b are enhanced. In addition, the semiconductor device 9 having the foregoing interconnection structure has an effect such that interlayer capacitance is reduced in the vicinity of the interconnect layer provided with these ordinary and fuse interconnects 7a and 7b. Therefore, the performance and quality of the semiconductor device 9 can be improved.

Second Embodiment

The second embodiment of the present invention will be explained below with reference to FIG. 6 to FIG. 10. FIG. 6 to FIG. 9 is a cross-sectional view to explain the process of manufacturing a semiconductor device according to the second embodiment. FIG. 10 is a cross-sectional view showing a semiconductor device according to the second embodiment. The same reference numerals are used to designate parts identical to the first embodiment, and the detailed explanation is omitted.

The second embodiment relates to a semiconductor device having the following interconnection structure and a method of manufacturing the same. According to the interconnection structure, the interconnect body of ordinary interconnect and fuse interconnect having a thickness different from the interconnect body are provided in the same interlayer insulating film. The ordinary interconnect is electrically connected with a lower-layer interconnect provided in the under interlayer insulating film via plug. The second embodiment will be detailedly explained below.

Figure 6:
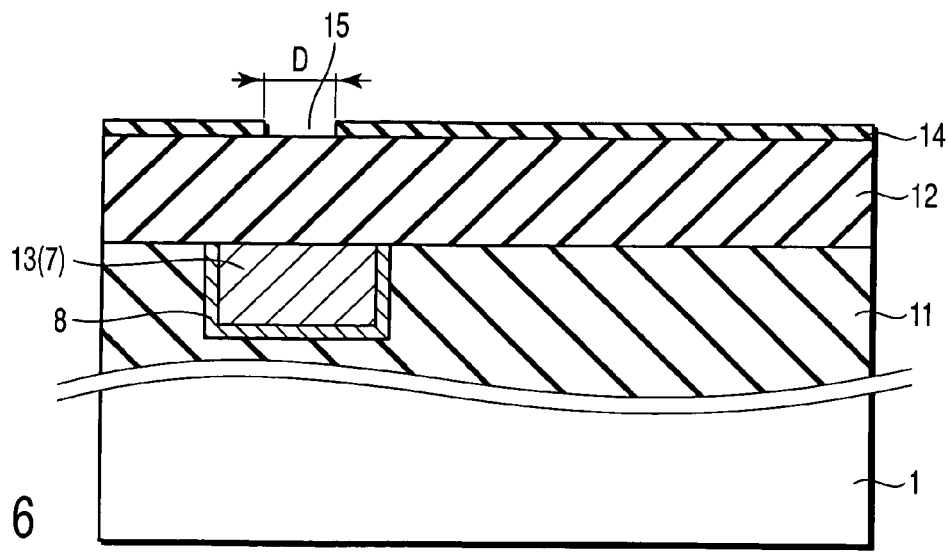
FIG. 6 is a cross-sectional view to explain the process of manufacturing a semiconductor device according to a second embodiment of the present invention.

As shown in FIG. 6, an interlayer insulating film (first insulating film) of an n-th layer 12 is provided on an interlayer insulating film of an (n–1)th layer 11 above a semiconductor substrate 1 via the same process as the first embodiment. In this case, n is integers more than 2. The interlayer insulating film of the (n–1)th layer 11 under one layer from the interlayer insulating film of the n-th layer 12 is provided with at least one lower-layer interconnect (lower-layer ordinary interconnect) 13 as a lower-layer conductor. The under layer interconnect 13 comprises a Cu film 7 only, which is the lower-layer interconnect body (lower-layer ordinary interconnect body), like ordinary and fuse interconnects 7a and 7b of the first embodiment. Moreover, the surface of the lower-layer interconnect (lower-layer Cu ordinary interconnect body) 13 is coated with a barrier metal film, that is, TaN film 8, like ordinary and fuse interconnects (ordinary and fuse interconnect bodies) 7a and 7b of the first embodiment.

As illustrated in FIG. 6, a third insulating film 14 having etching rate (processing selectivity) smaller than the interlayer insulating film of the n-th layer 12 is provided on the film 12. Specifically, an etching stopper film 14 is provided on the interlayer insulating film of the n-th layer 12 using CVD process. In this case, the etching stopper film 14 has etching rate smaller than the interlayer insulating film of the n-th layer 12 and a thickness thinner than there. For example, SiN film may be used as the etching stopper film 14. At least one through hole 15 is formed above at least one lower-layer Cu ordinary interconnect (lower-layer Cu interconnect body) provided in the interlayer insulating film of the (n–1)th layer 11 to penetrate through the etching stopper 14 along the thickness direction. The through hole is formed using general lithography technique and etching such as RIE. The through hole 15 is used as a via hole pattern for forming a third recess (via hole) 19 described later in the interlayer insulating film of the n-th layer 12 above the lower-layer ordinary interconnect 13. A width (diameter) D of the through hole 15 shown in FIG. 6 is the same as the width (diameter) of the third recess (via hole) 19 formed communicating with the via hole pattern 19 as described later.

Figure 7:
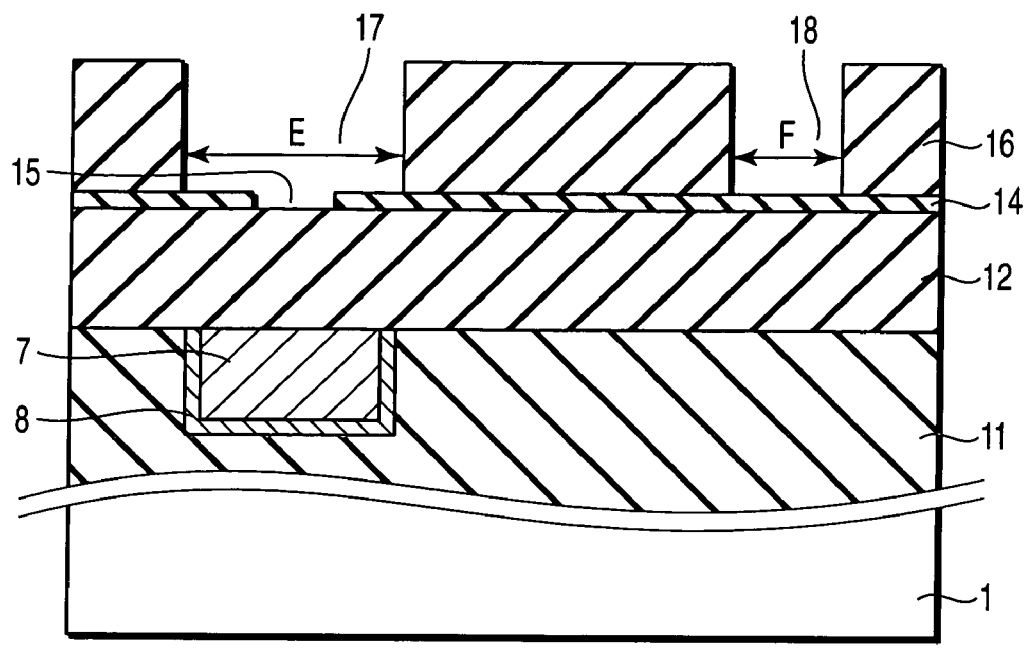
FIG. 7 is a cross-sectional view to explain the process of manufacturing a semiconductor device according to a second embodiment.

As depicted in FIG. 7, an interlayer insulating film (first insulating film) of an (n+1)th layer 16 is provided to cover the etching stopper film 14 and the exposed surface of the interlayer insulating film of the n-th layer 12 via the via hole pattern 15, using the same film forming process as the film 12. Then, the interlayer insulating film of the (n+1)th layer 16 is formed concurrently with first and second recesses 17 and 18 using general lithography technique and etching such as RIE, like the first embodiment. In this case, according to the second embodiment, the first and second recesses 17 and 18 are formed through the interlayer insulating film of the (n+1)th layer 16 along the thickness direction until the surface of the etching stopper film 14 is exposed. Specifically, at least one first recess 17 having a first width E shown in FIG. 7 is formed above the via hole pattern 15 to penetrate through the interlayer insulating film of the (n+1)th layer 16 along the thickness direction. Simultaneously, at least one second recess 18 having a second width F shown in FIG. 7 is formed outside the via hole pattern 15 to penetrate through the interlayer insulating film of the (n+1)th layer 16 along the thickness direction.

As described later, the first recess 17 formed in the interlayer insulating film of the (n+1)th layer 16 is used for a body 21 of an upper-layer ordinary interconnect (upper-layer Cu ordinary interconnect) 23. The upper-layer ordinary interconnect 23 is electrically connected with the lower-layer ordinary interconnect 13 provided in the interlayer insulating film of the (n−1)th layer 11. Therefore, the first recess 17 formed in the interlayer insulating film of the (n+1)th layer 16 functions as an upper-layer ordinary interconnect formation recess. On the other hand, the second recess formed in the film 16 functions as a fuse interconnect formation recess, like the first embodiment.

The correlation between the width E of the upper-layer ordinary interconnect formation recess 17 and the width of the fuse interconnect formation recess 18 is the same as the correlation described in the first embodiment. That is, the correlation between the width A of the ordinary interconnect formation recess 3 and the width of the fuse interconnect formation recess 4. Specifically, the width of the fuse interconnect formation recess 18 is set to about ½ of the width E of the upper-layer ordinary interconnect formation recess 17. In this case, according to the second embodiment, the width E of the upper-layer ordinary interconnect formation recess 17 is set to the same size or more in which a size twice the thickness of a second insulating film 5 described later is added to the width (diameter) D of the via hole pattern 15. Accordingly, the foregoing setting serves to prevent the second insulating film 5 from closing the opening of the via hole pattern 15 even if the film 5 remains at both insides of the recess 17.

In particular, the width E of the upper-layer ordinary interconnect formation recess 17 is set to a value larger than the size in which a size twice the thickness of the second insulating film 5 is added to the diameter D of the via hole pattern 15 in the second embodiment. In other words, the width E of the recess 17 is set to a value larger than the size in which a size twice the thickness of the second insulating film 5 is added to the diameter D of a via hole 19 (described later) formed communicating with the via hole pattern 15. Specifically, the width E of the recess 17 is set so that a width of an upper-layer ordinary interconnect body 21 described later becomes larger than a width (diameter) of a via plug 22.

Figure 8:
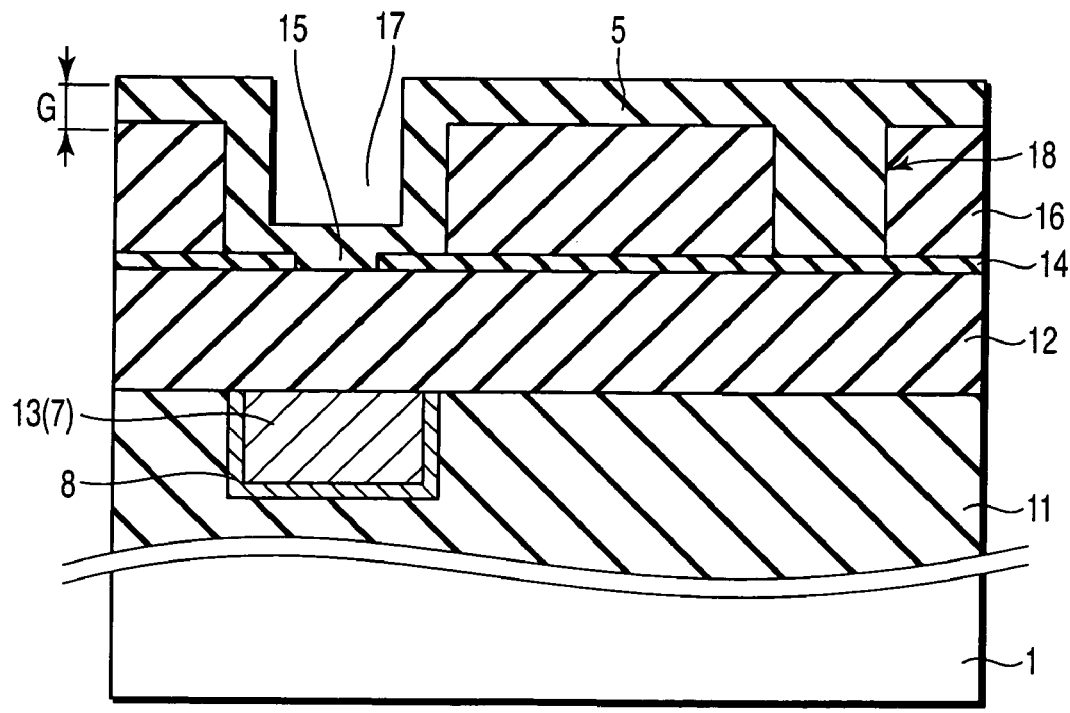
FIG. 8 is a cross-sectional view to explain the process of manufacturing a semiconductor device according to a second embodiment.

As shown in FIG. 8, a second insulating film 5 is provided to cover the following surfaces via the same process as the first embodiment. One of the surfaces is the surface of the interlayer insulating film of the (n+1)th layer 16 formed with the upper-layer ordinary and fuse interconnect formation recesses 17 and 18. Another is the surface of the etching stopper film 14 exposed via the upper-layer ordinary interconnect formation recess 17. Another is the surface of the interlayer insulating film of the n-th layer 12. In this case, a thickness G of the second insulating film 5 shown in FIG. 8 is set to the same as the thickness C of the second insulating film described in the first embodiment. Specifically, the thickness G of the second insulating film 5 is set to about ¼ of the width (first width) E of the upper-layer ordinary interconnect formation recess 17. In this process, the fuse interconnect formation recesses 18 is fully filled with the second insulating film 5, like the first embodiment.

As illustrated in FIG. 9, the second insulating film 5 is anisotropically removed along the thickness direction via the same etching process as the first embodiment so that the film 5 remains at both insides of the 17. In this case, the second insulating film 5 is anisotropically removed along the thickness direction until the surface of the etching stopper film 14 below the upper-layer ordinary interconnect formation recess 17 is exposed. The foregoing etching process is carried out, and thereby, the width of the recess 17 is substantially set to about ½ of the first width E before the second insulating film 5 is provided in the recess 17, like the first embodiment. In other words, the width of the recess 17 is substantially the same as the width (second width) F of the fuse interconnect formation recess 18.

Moreover, the second insulating film 5 is left on the lower part (bottom) of the fuse interconnect formation recess 18 via the foregoing etching process, like the first embodiment. By doing so, the fuse interconnect formation recess 18 is formed having the same width as the recess 17 formed with the second insulating film 5 at its both insides and shallower than the recess 17.

Moreover, the second insulating film 5 left at both insides of the foregoing recess 17 functions as an upper-layer ordinary interconnect protect film 5a, like the first embodiment. The upper-layer ordinary interconnect protect film 5a prevents the quality of an upper ordinary interconnect 23 (upper ordinary interconnect body 21) from being reduced. Likewise, the second insulating film 5 left on the bottom of the foregoing recess 18 functions as a fuse interconnect protect film 5b. The fuse interconnect protect film 5b prevents the quality of the fuse interconnect (fuse interconnect body) 7b from being reduced.

As seen from FIG. 9, a third recess (third trench) 19 is formed at least one using anisotropic etching such as RIE. The third recess 19 is formed penetrating through the interlayer insulating film of the n-th layer 12 below the via hole pattern 15 along the thickness direction to communicate with the via hole pattern. In this case, the interlayer insulating film of the n-th layer 12 below the via hole pattern 15 is anisotropically etched so that a width (diameter) H of the third recess 19 shown in FIG. 9 becomes the same size as the diameter D of the via hole pattern 15 shown in FIG. 6. The width H of the third recess 19 is set to a value smaller than the size subtracting a size twice the thickness G of the foregoing film 5a from the width E of the recess 17. The setting is made in the manner as described above, and thereby, the third recess 19 has the same diameter as the via hole pattern 15. In addition, the third recess communicating with the lower part (bottom) of the recess 17 via the via hole pattern 15 is formed in the interlayer insulating film the n-th layer 12 above the lower-layer Cu ordinary interconnect 13. The third recess 19 is formed to reach the surface of the lower-layer Cu ordinary interconnect (lower-layer Cu ordinary interconnect body) 13, as shown in FIG. 9. As a result, the surface of the lower-layer Cu ordinary interconnect 13 is exposed via the third recess 19.

The third recess 19 functions as a plug formation recess for providing a plug 22. The plug 22 electrically connects the body 21 of the upper-layer ordinary interconnect 23 provided in the interlayer insulating film of the (n+1)th layer 16 with the lower-layer Cu ordinary interconnect provided in the interlayer insulating film of the (n−1)th layer 11. In other words, the third recess 19 functions as a via hole for providing a via plug 22 (described later) in the interlayer insulating film the n-th layer 12.

As depicted in FIG. 10, a conductor 20 is provided in each of the foregoing first to third recesses via the same process as the first embodiment. That is, the first recess is the upper-layer ordinary interconnect formation recess 17 where the upper-layer ordinary interconnect protect film 5a is left at its both insides. The second recess is the fuse interconnect formation recess 18 where the fuse interconnect protect film 5b is left on the bottom. The third recess is the via hole 19 communicating with the upper-layer ordinary interconnect formation recess 17. Specifically, a barrier metal film, that is, TaN film 8 is provided using CVD process to cover the following surfaces. The surfaces include the surface of the protect film 5a of the recess 17, the surface of the etching stopper film 14 forming the bottom of the recess 17 and the inside surface of the via hole 19. In addition, the surfaces include the surface of the lower-layer ordinary interconnect 13, the inside surface of the recess 18 and the surface of the protect film 5b of the recess 18 and the surface of the interlayer insulating film of the (n+1)th layer 16. Then, Cu film 7 functioning as upper-layer ordinary interconnect body 21, via plug 22 and fuse interconnect body 7b is provided using Cu plating to cover the surface of the TaN film 8. The Cu film 7 is provided to fully fill each of the upper-layer ordinary interconnect formation recess 17, the fuse interconnect formation recess 18 and the via hole 19.

Thereafter, Cu film 7 and TaN film 8 provided on the surface of the interlayer insulating film of the (n+1)th layer 16 are polished and removed using CMP process. By doing so, unnecessary Cu film 7 and TaN film 8 are removed. Therefore, the foregoing upper-layer ordinary interconnect formation recess 17, fuse interconnect formation recess 18 and via hole 19 are filled with these Cu film 7 and TaN film 8.

As a result, as seen from FIG. 10, Cu film 7 and TaN film 8 are provided in the upper-layer ordinary interconnect protect film 5a provided on both insides of the upper-layer ordinary interconnect formation recess 17. In this case, the foregoing Cu film 7 and TaN film 8 are provided over the range from the opening of the recess 17 to the surface of the lower-layer Cu ordinary interconnect (lower-layer Cu ordinary interconnect body) 13 via the via hole pattern 15 and via hole 19. The Cu film 7 provided in the upper-layer ordinary interconnect formation recess 17 functions as an upper-layer ordinary interconnect body (upper-layer Cu ordinary interconnect body) 21 of an upper-layer ordinary interconnect (upper-layer Cu ordinary interconnect) 23. The Cu film 7 provided in the via hole 19 functions as a via plug (Cu via plug) 22, which electrically connects the upper-layer ordinary interconnect body 21 with the lower-layer ordinary interconnect (lower-layer ordinary interconnect body) 13. According to the second embodiment, the upper-layer ordinary interconnect body 21 is provided in the interlayer insulating film of the (n+1)th layer 16 while the via plug 22 is provided in the interlayer insulating film of the n-th layer 12 below the film of the (n+1)th layer 16.

The upper-layer ordinary interconnect 23 of this embodiment is composed of the upper-layer ordinary interconnect body 21 provided in the (n+1)th layer and the via plug provided in the n-th layer, as seen from FIG. 10. Moreover, the interconnect 23 is formed as a so-called dual-damascene interconnect having the structure in which the upper-layer ordinary interconnect body 21 is provided integrally with the via plug 22, as is evident from FIG. 10. The width E of the upper-layer ordinary interconnect formation recess 17 is set to a value larger than the following size. The size is obtained by adding a size twice the thickness G (shown In FIG. 8) of the upper-layer ordinary protect film 5a to the diameter D (shown in FIG. 6) of the via hole pattern 15 or the diameter H (shown in FIG. 9) of the via hole 19. Therefore, the upper-layer ordinary interconnect body 21 is electrically connected with the lower-layer ordinary interconnect (lower-layer ordinary interconnect body) 13 via the via plug 22 having a width narrower than the interconnect body 21.

The foregoing CMP process is carried out; as a result, the fuse interconnect formation recess 18 is provided with Cu film 7 and TaN film 8. Specifically, these Cu film 7 and TaN film 8 are provided over the range from the opening of the recess 18 to the upper surface of the fuse interconnect protect film 5b on the lower part of the recess 18. In other words, the recess 18 is provided with the fuse interconnect (Cu fuse interconnect) 7b, which comprises Cu film 7, that is, fuse interconnect body (cu fuse interconnect body) only concurrently with the upper-layer ordinary interconnect 23.

Thereafter, a predetermined process is carried out, thereby obtaining a semiconductor device 24 according to the second embodiment having a desired interconnection structure shown in FIG. 10. Specifically, the semiconductor device 24 having the following interconnection structure is obtained. According to the structure, the upper-layer ordinary interconnect body 21 of the upper-layer ordinary interconnect 23 is formed integrally with the via plug 22, and electrically connected with the lower-layer ordinary interconnect 13 via the via plug 22. On the other hand, the fuse interconnect (fuse interconnect body) 7b is formed having a thickness thinner than the upper-layer ordinary interconnect body 21. Moreover, the foregoing upper-layer ordinary interconnect body 21 and fuse interconnect 7b are provided in the same interlayer insulating film of the (n+1)th layer 16 at least one by one.

As described above, according to the second embodiment, the same effect as the first embodiment is obtained. Moreover, according to the second embodiment, the etching stopper film 14 is interposed between the n-th and the (n+1)th interlayer insulating films 12 and 16, having etching rate lower than these films 12 and 16. The etching stopper film 14 is formed with the via hole pattern 15 to specify the position and size of the via hole 19. By doing so, it is possible to readily and effectively manufacture the semiconductor device 24 having the following interconnection structure. According to the interconnection structure, the body 21 of the upper-layer ordinary interconnect 23 and the fuse interconnect body 7b are provided in the same interlayer insulating film of the (n+1)th layer 16 at least one by one. In this case, the foregoing body 21 of the interconnect 23 is provided having the dual-damascene structure in continuous upper and lower two interlayer insulating films 12 and 16. More specifically, the semiconductor device 24 having the following interconnection structure is readily and effectively manufactured. According to the interconnection structure, the upper-layer ordinary interconnect body 21 and the fuse interconnect body 7b having mutually different thickness are provided in the same interlayer insulating film of the (n+1)th layer 16 at least one by one. The via plug 22 is formed integrally with the upper-layer ordinary interconnect body 21 to electrically connect the interconnect body 21 with the lower-layer ordinary interconnect 13 provided in the interlayer insulating film the (n−1)th layer 11. The via plug 22 is provided in the interlayer insulating film of the n-th layer 12 different from the interlayer insulating film of the (n+1)th layer 16.

Third Embodiment

The third embodiment of the present invention will be explained below with reference to FIG. 11 to FIG. 16. FIG. 11 to FIG. 15 is a cross-sectional view to explain the process of manufacturing a semiconductor device according to the third embodiment. FIG. 16 is a cross-sectional view showing a semiconductor device according to the third embodiment. The same reference numerals are used to designate parts identical to the foregoing first and second embodiments, and the detailed explanation is omitted.

The third embodiment differs from the foregoing second embodiment in the following point. That is, the third embodiment relates to a semiconductor device having the following interconnection structure, and to a method of manufacturing the same. According to the interconnection structure, an interconnect body of upper-layer ordinary interconnect and a fuse interconnect having a thickness different from the body are provided in the same interlayer insulating film. Moreover, a plug electrically connecting the body of the upper-layer ordinary interconnect with a lower-layer interconnect is provided in the same interlayer insulating film as the foregoing interconnect body and fuse interconnect. The detailed explanation will be given below.

As shown in FIG. 11, an interlayer insulating film (first insulating film) of an n-th layer 31 is provided on the interlayer insulating film of the (n−1)th layer 11 above a semiconductor substrate 1, like the second embodiment. The interlayer insulating film of the (n−1)th layer 11 is provided with at least one lower-layer ordinary interconnect 13 coated with TaN film 8.

The interlayer insulating film of the n-th layer 31 is provided concurrently with first and second recesses 32 and 33 at least one by one using normal lithography technique and etching such as RIE, like the second embodiment. However, the third embodiment differs from the second embodiment in the following point. Specifically, these first and second recesses 32 and 33 are formed having a predetermined depth such that they do not penetrate through the interlayer insulating film of the n-th layer 31 along the thickness direction. The first recess 32 is formed above the lower-layer ordinary interconnect 13 to function as an upper-layer ordinary interconnect formation recess. The second recess 33 is formed at a position off above the lower-layer ordinary interconnect 13 to function as a fuse interconnect formation recess.

The width of the upper-layer ordinary interconnect formation recess 32 is set to a first width I shown in FIG. 11. On the other hand, the width of the fuse interconnect formation recess 33 is set to a second width J shown in FIG. 11. In the third embodiment, the correlation between the width I of the upper-layer ordinary interconnect formation recess 32 and the width J of the fuse interconnect formation recess 33 is the same as described in the first and second embodiments. That is, in the first embodiment, the correction between the width A of the ordinary interconnect formation recess 3 and the width B of the fuse interconnect formation recess 4 is given. In the second embodiment, the width E of the upper-layer ordinary interconnect formation recess 17 and the width F of the fuse interconnect formation recess 18 is given. Specifically, the width J of the fuse interconnect formation recess 33 is set to ½ of the width I of the upper-layer ordinary interconnect formation recess 32.

The width I of the recess 32 is set to the same size or more in which a size twice the thickness of a second insulating film 5 is added to a width of a third recess 35 (via hole 35a) described later. The foregoing setting serves to obtain the following advantages. Specifically, even if the second insulating film 5 is left at both insides of the recess 32, the setting serves to prevent the second insulating film 5 from closing the third recess 35 or to prevent the third recess 35 from removing the second insulating film 5. In particular, according to the third embodiment, the width I of the recess 32 is set to a value larger than a size in which a size twice the thickness of a second insulating film 5 is added to the width of the third recess 35. Specifically, the width I of the recess 32 is set to a value such that the width of an upper-layer ordinary interconnect body 37 described later becomes larger than the width (diameter) of a via plug 38.

As illustrated in FIG. 12, the second insulating film 5 is provided to cover the surface of the interlayer insulating film of the n-th layer 31 formed with the foregoing recesses 32 and 33 via the same process as the first and second embodiments. In this case, a thickness K of the insulating film 5 shown in FIG. 12 is set to the same as the thickness C of the film 5 of the first embodiment and the thickness G of the film 5 of the second embodiment. Specifically, the thickness K of the insulating film 5 is set to about ¼ of the width (first width) I of the upper-layer ordinary interconnect formation recess 32. The foregoing process is carried out, and thereby, the fuse interconnect formation recess 33 is fully filled with the second insulating film 5, like the first and second embodiments.

Figure 13:
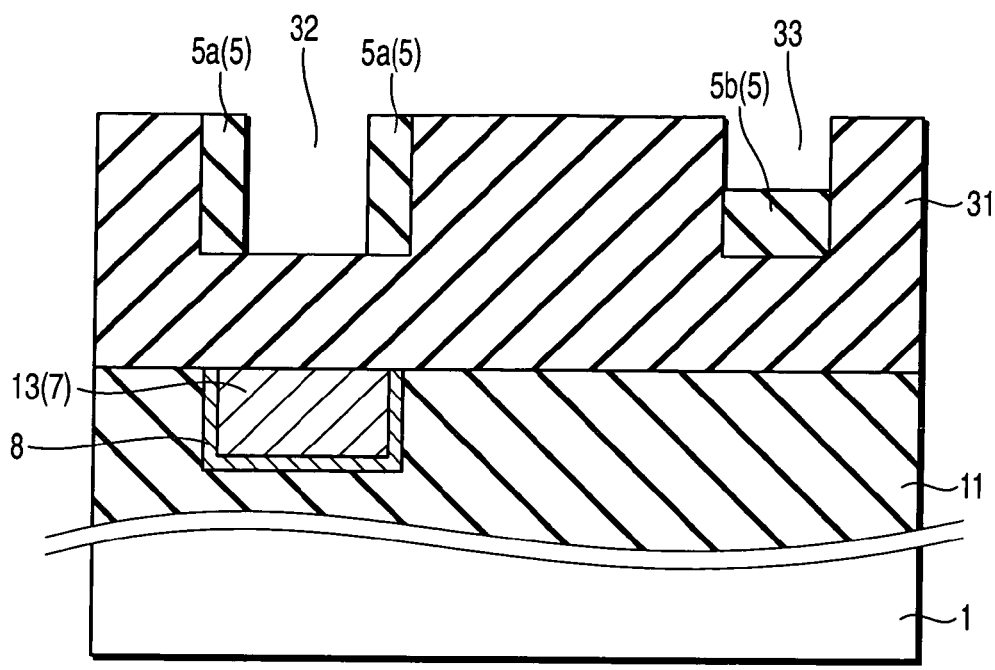
FIG. 13 is a cross-sectional view to explain the process of manufacturing a semiconductor device according to a third embodiment.

As depicted in FIG. 13, the second insulating film 5 is anisotropically removed along the thickness direction via the same etching process as the first and second embodiments so that the film 5 remains at both insides of the 17. In this case, the second insulating film 5 is anisotropically removed along the thickness direction until the bottom of the upper-layer ordinary interconnect formation recess 32 is exposed. The foregoing etching process is carried out, and thereby, the width of the recess 32 is substantially set to about ½ of the first before the second insulating film 5 is provided in the recess 32. In other words, the width of the recess 33 is substantially the same as the width (second width) J of the fuse interconnect formation recess 33. Moreover, the second insulating film 5 left at both insides of the foregoing recess 32 functions as an upper-layer ordinary interconnect protect film 5a.

On the other hand, the foregoing etching process is carried out, and thereby, the second insulating film 5 is left on the lower part (bottom) of the fuse interconnect formation recess 33. By doing so, the fuse interconnect formation recess 33 is formed having the same width as the recess 32 formed with the second insulating film 5 at its both insides and shallower than the recess 32. The second insulating film 5 left on the bottom of the fuse interconnect formation recess 33 functions as a fuse interconnect protect film 5b.

Figure 14:
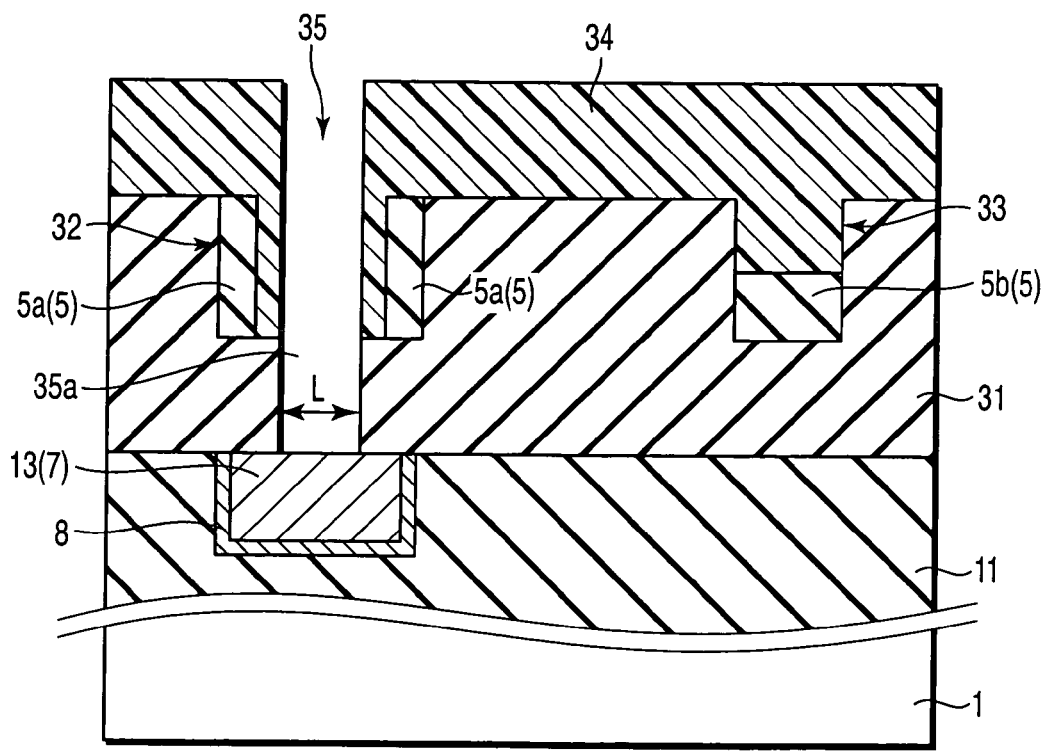
FIG. 14 is a cross-sectional view to explain the process of manufacturing a semiconductor device according to a third embodiment.

As seen from FIG. 14, a resist film 34 is provided on the surface of the interlayer insulating film of the n-th layer 31 to fully fill the foregoing upper-layer ordinary interconnect formation recess 32 and fuse interconnect formation recess 33. Then, a third recess 35 is formed using normal lithography technique and etching such as RIE. In this case, the third recess 35 is formed to penetrate through the resist film 34 and the interlayer insulating film of the n-th layer 31 along the thickness direction and to reach the surface of the lower-layer ordinary interconnect 13.

Specifically, the resist film 34 is formed with a resist pattern of the third recess 35 so that the resist pattern is be positioned above the interconnect 13 and inside the second insulating film 5 left on both insides of the recess 32. Thereafter, based on the resist pattern of the third recess 35 formed in the resist film 34, the resist film 34 and the interlayer insulating film of the n-th layer 31 is etched along the thickness direction using anisotropic etching such as RIE. By doing so, the third recess 35 is formed to communicate with the upper-layer ordinary interconnect formation recess 32 and to expose the surface of the lower-layer ordinary interconnect 13. Therefore, the third recess 35 is formed in the resist film 34 and the interlayer insulating film of the n-th layer 31 above the interconnect 13 and at inside the second insulating film 5 left on both insides of the recess 32.

A width L of the third recess 35 shown in FIG. 14 is set to the same as the width H of the third recess 19 described in the second embodiment. The width L of the third recess 35 is set to a value smaller than the size subtracting a size twice the thickness K of the foregoing film 5a from the width I of the recess 32. Of the third recess 35, a part 35a formed below the upper-layer ordinary interconnect formation recess 32 functions as a plug formation recess for providing a plug 38. The plug 38 electrically connects a body 37 of an upper-layer ordinary interconnect 39 (described later) provided in the interlayer insulating film of the n-th layer 31 with the lower-layer Cu ordinary interconnect 13 provided in the interlayer insulating film of the (n−1)th layer 11. In other words, of the third recess 35, the part 35a communicating with the lower part of the recess 32 functions as a via hole for providing a via plug 38 in the interlayer insulating film of the n-th layer 31.

Figure 15:
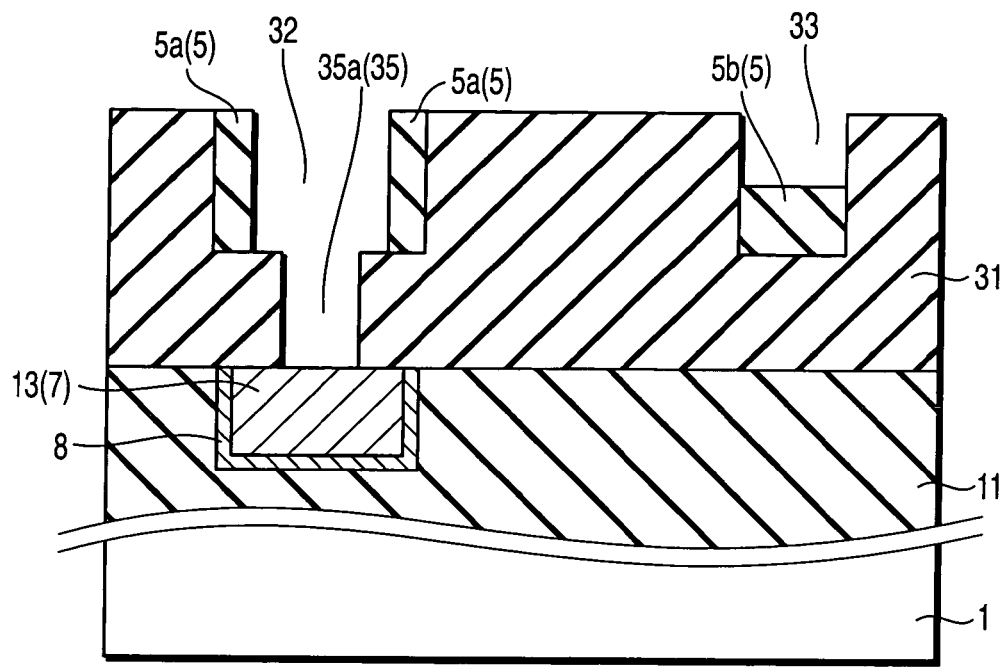
FIG. 15 is a cross-sectional view to explain the process of manufacturing a semiconductor device according to a third embodiment.
Figure 16:
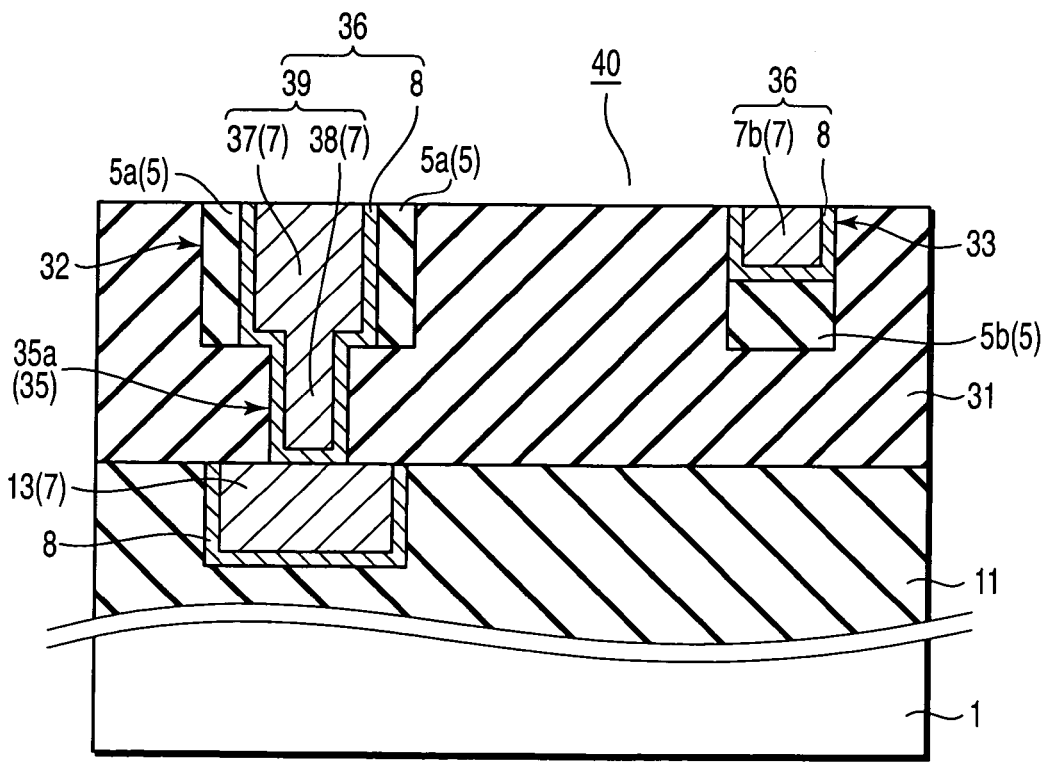
FIG. 16 is a cross-sectional view showing a semiconductor device according to a third embodiment of the present invention.

As shown in FIG. 15, the resist film 34 is removed from the surface of the interlayer insulating film of the n-th layer 31 formed with the third recess 35, the foregoing recesses 32 and 33. In this case, the resist film 34 is removed using isotropic etching such as wet etching.

As depicted in FIG. 16, an upper-layer conductor 36 is provided in each of the foregoing first to third recesses via the same process as the first and second embodiments. That is, the first recess is the upper-layer ordinary interconnect formation recess 32 where the upper-layer ordinary interconnect protect film 5a is left at its both insides. The second recess is the fuse interconnect formation recess 33 where the fuse interconnect protect film 5b is left on the bottom. The third recess is the via hole 35a communicating with the upper-layer ordinary interconnect formation recess 32. Specifically, a barrier metal film, that is, TaN film 8 is provided using CVD process to cover the following surfaces. The surfaces include the surface of the protect film 5a of the recess 32, the bottom of the recess 32, the inside surface of the via hole 19. In addition, the surfaces include the surface of the lower-layer ordinary interconnect 13, the inside surface of the recess 33, the surface of the protect film 5b of the recess 33 and the surface of the interlayer insulating film of the n-th layer 31. Then, Cu film 7 functioning as upper-layer ordinary interconnect body 37, via plug 38 and fuse interconnect body 7b is provided using Cu plating to cover the surface of the TaN film 8. The Cu film 7 is provided to fully fill each of the upper-layer ordinary interconnect formation recess 32, the fuse interconnect formation recess 33 and the via hole 35a.

Thereafter, Cu film 7 and TaN film 8 provided on the surface of the interlayer insulating film of the n-th layer 31 are polished and removed using CMP process. By doing so, unnecessary Cu film 7 and TaN film 8 are removed. Therefore, the foregoing upper-layer ordinary interconnect formation recess 32, fuse interconnect formation recess 33 and via hole 35a are filled with these Cu film 7 and TaN film 8.

As a result, as seen from FIG. 16, Cu film 7 and TaN film 8 are provided in the upper-layer ordinary interconnect protect film 5a provided on both insides of the upper-layer ordinary interconnect formation recess 32. In this case, the foregoing Cu film 7 and TaN film 8 are provided over the range from the opening of the recess 32 to the surface of the lower-layer interconnect 13 inside the protect film 5a provided at both insides of the recess 32. The Cu film 7 provided in the recess 32 functions as an upper-layer ordinary interconnect body 37 of an upper-layer ordinary interconnect 39. The Cu film 7 provided in the via hole 35a functions as a via plug 38, which electrically connects the upper-layer ordinary interconnect body 37 with the lower-layer ordinary interconnect 13. As seen from FIG. 16, the upper-layer ordinary interconnect 39 of the third embodiment is formed as a so-called dual damascene interconnect having the structure in which the upper-layer ordinary interconnect body 37 is provided integrally with the via plug 38. However, the third embodiment differs from the second embodiment in that the body 37 of the upper-layer ordinary interconnect 39 and the via plug are integrally provided in the same interlayer insulating film of the n-th layer 31.

The foregoing CMP process is carried out; as a result, the fuse interconnect formation recess 33 is provided with Cu film 7 and TaN film 8. Specifically, these Cu film 7 and TaN film 8 are provided over the range from the opening of the recess 33 to the upper surface of the fuse interconnect protect film 5b on the lower part of the recess 33. In other words, the recess 33 is provided with the fuse interconnect 7b, which comprises Cu film 7, that is, fuse interconnect body only concurrently with the upper-layer ordinary interconnect 39.

Thereafter, a predetermined process is carried out, thereby obtaining a semiconductor device 40 according to the second embodiment having a desired interconnection structure shown in FIG. 16. Specifically, the semiconductor device 40 having the following interconnection structure is obtained. According to the structure, the upper-layer ordinary interconnect 39 and the fuse interconnect 7b are provided in the same interlayer insulating film of the n-th layer 31 at least one by one. The interconnect 39 has having a dual-damascene structure in which the upper-layer ordinary interconnect body 37 is formed integrally with the via plug 38 electrically connected with the lower-layer ordinary interconnect 13 via the via plug 22. On the other hand, the fuse interconnect 7b is formed having a thickness thinner than the upper-layer ordinary interconnect body 37.

As described above, according to the third embodiment, the same effect as the first embodiment is obtained. Moreover, the third embodiment differs from the foregoing first and second embodiments in the following point. The upper-layer ordinary interconnect 39 is provided in one interlayer insulating film 31 without stacking two interlayer insulating films 12 and 16 and interposing the etching stopper film 14 between these films. In this case, the upper-layer ordinary interconnect 39 has a dual-damascene structure in which the upper-layer ordinary interconnect body 37 and the via plug 38 are integrally formed. Concurrently, the fuse interconnect 7b having a thickness different from the interconnect body 37 is provided in the same interlayer insulating film of the n-th layer 31 as the interconnect 39 via the identical process. Therefore, it is possible to more readily and effectively manufacture the semiconductor device 40 including the same interconnection structure as the semiconductor device 24 of the second embodiment.

The semiconductor device of the present invention and the method of manufacturing the same are not limited to the foregoing first to third embodiments. These configurations or manufacturing processes may b variously changed, or various settings may be properly combined within the scope without diverging from the subject matter of the present invention.

For example, the material of ordinary interconnect 7a, fuse interconnect 7b, lower-layer interconnect 13, upper-layer ordinary interconnects 21 and 39 is not limited to Cu (copper). To give an example, Al (aluminum) may be used as the material of these interconnects 7a, 7b, 13, 21 and 39. In particular, if upper-layer ordinary interconnects 21, 39 and fuse interconnect 7b are provided in the upper-most layer where they are exposed in the atmosphere, it is preferable to form these interconnects 21, 39 and 7b using Al hard to be oxidized. If interconnects 7a, 7b 21 and 39 are formed of Al, the barrier metal film 8 for coating these interconnects 7a, 7b, 21 and 39 is not necessarily provided. In addition, the barrier metal film 8 for coating these interconnects 7a, 7b, 21 and 39 is not limited to one layer. The barrier metal film 8 for coating these interconnects 7a, 7b, 21 and 39 may be composed of two layers or more. In other words, the material of conductor, upper-layer and lower-layer conductors used for the first to third embodiments is not limited to two kinds. A proper material may be used as the material of conductor, upper-layer and lower-layer conductors used for forming interconnects 7a, 7b, 21, 39 and barrier metal film 8 in accordance with the specifications of desired semiconductor devices 9, 24 and 40.

The material of the barrier metal film 8 is not limited to the TaN film. A proper kinds of material may be used as the barrier metal film 8 in accordance with the material of the interconnects 7a, 7b, 13, 21 and 39. For example, films consisting of a single element such as Ta, Ti, Nb, W and Zr, and these nitride films or films stacking each single element film and each nitride film may be used as the material of the barrier metal film 8. Likewise, the materials of interlayer insulating films 2, 11, 12, 16, 31, protect film 5 and etching stopper film 14 are not limited to the foregoing material. Proper kinds of material may be used as the material of these films 2, 5, 11, 12, 16 and 31 in accordance with the specifications of desired semiconductor devices 9, 24 and 40.

The foregoing ordinary interconnect 7a, fuse interconnect 7b, upper-layer ordinary interconnects 21 and 39 are not necessarily provided in the uppermost layer. These interconnects may be provided in a predetermined layer above a semiconductor substrate. Likewise, the lower-layer interconnect (lower-layer conductor) 13 is not necessarily provided in a layer under one or two from the layer in which the body 21, 37 of the upper-layer interconnects 23, 39 is provided. Of course, the lower-layer interconnect 13 may be provided in a layer under three or more from the layer in which the body 21, 37 of the upper-layer interconnects 23, 39 is provided. In this case, the length of the via plug 22; 38 may be properly in accordance with the distance between the lower-layer interconnect 13 and the body 21, 37 of the upper-layer interconnects 23, 39. The lower-layer interconnect (lower-layer conductor) 13 is not necessarily provided in the interlayer insulating film of the (n−1)th layer 11. For example, it is a matter of course that the lower-layer interconnect (lower-layer conductor) 13 may be a conductive layer such as various substrate interconnects provided in the surface of the semiconductor substrate. In this case, a plug used for connecting the body 21, 37 of the upper-layer interconnects 23, 39 with the lower-layer conductor is a contact plug.

The upper-layer interconnects 23; 39 described in the second and third embodiments do not necessarily have a dual-damascene structure. Of course, the upper-layer interconnects 23; 39 may have a so-called single-damascene structure in which the body 21; 37 are formed independently from via plugs 22, 38.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   at least one first insulating film provided above a substrate, being formed with at least one first recess having a first width, and being formed with at least one second recess having a second width which is 1/x (x: positive numbers larger than 1) a size of the first width and having a same depth as the first recess;
   a second insulating film provided at both sides of the first recess and at a lower part of the second recess; and
   a conductor provided inside of the second insulating films provided at the both sides of the first recess with extending from an opening of the first recess to a bottom surface thereof, and provided in the second recess with extending from an opening of the second recess to an upper surface of the second insulating film provided at the lower part of the second recess.

2. The device according to claim 1, wherein plurality of the first insulating films are provided above the substrate in a state of being stacked, and the first and second recesses are formed in a first insulating film of an uppermost layer of the first insulating films at least one by one respectively.

3. The device according to claim 1, wherein the conductor provided in the second recess is formed as a fuse interconnect.

4. The device according to claim 1, further comprising:
   the first insulating film is provided at an (n+1)th layer (n: 2 or more integers);
   a third insulating film provided under the first insulating film of the (n+1)th layer, which is formed of a material having an processing selectivity smaller than that of the first insulating film;
   a first insulating film of an n-th layer provided under the first insulating film of the third insulating film;
   a first insulating film of an (n−1)th layer provided under the first insulating film of the n-th layer;
   at least one lower-layer conductor provided in the first insulating film of the (n−1)th layer;

at least one third recess formed in the first insulating film of the n-th layer through along a thickness direction thereof and extending to a surface of the lower-layer conductor above at least one said lower-layer conductor;

at least one through hole formed in the third insulating film through along a thickness direction thereof and communicating with the third recess above the third recess;

at least the one first recess formed in the first insulating film of the (n+1)th layer through along a thickness direction thereof above the through hole, which is communicating with the through hole and having the first width larger than a diameter of the through hole;

at least the one second recess formed in the first insulating film of the (n+1)th layer through along the thickness direction thereof at a position off above the through hole;

the second insulating film in the first recess is provided at a position off above the through hole; and the conductors in the first and second recesses are provided as an upper-layer conductors, and the conductor in the first recess is extending to the surface of the lower-layer conductor with extending from an inside of the first recess to an inside of the third recess via the through hole.

5. The device according to claim 4, wherein the first insulating film of the (n+1)th layer is provided above the substrate as a first insulating film of an uppermost layer, and the first and second recesses are formed in the first insulating film of the uppermost layer at least one by one respectively.

6. The device according to claim 4, wherein the conductor provided in the second recess is formed as a fuse interconnect.

7. The device according to claim 1, further comprising:
the first insulating film is provided at an n-th layer (n: 2 or more integers);
a first insulating film of an (n−1)th layer provided under the first insulating film of the n-th layer;
at least one lower-layer conductor provided in the first insulating film of the (n−1)th layer;
at least the one first recess formed in the first insulating film of the n-th layer along a thickness direction from an upper surface to an intermediate part thereof above at least the one lower-layer conductor;
at least one third recess formed in the first insulating film of the n-th layer along the thickness direction from the intermediate part to a lower surface thereof, which is communicating with a lower part of the first recess and extending to a surface of the lower-layer conductor;
at least the one second recess formed in the first insulating film of the n-th layer at a position different from a part formed the first recess;
the second insulating film in the first recess is provided at a position off an opening of the third recess; and
the conductors in the first and second recesses are provided as an upper-layer conductors, and the conductor in the first recess is extending to the surface of the lower-layer conductor with extending from an inside of the first recess to an inside of the third recess.

8. The device according to claim 7, wherein the first insulating film of the n-th layer is provided above the substrate as a first insulating film of an uppermost layer, and the first and second recesses are formed in the first insulating film of the uppermost layer at least one by one respectively.

9. The device according to claim 7, wherein the conductor provided in the second recess is formed as a fuse interconnect.

10. A method of manufacturing a semiconductor device comprising:
forming a first recess having a first width, and a second recess having a second width which is 1/x (x: positive numbers larger than 1) a size of the first width and having a same depth as the first recess in at least one layer of a first insulating film at least one by one respectively;
providing a second insulating film until its thickness coming up to ½x a size of the first width with covering a surface of the first insulating film being formed with the first and second recesses;
anisotropically removing the second insulating film provided on the surface of the first insulating film mainly along a thickness direction thereof until the bottom of the first recess is exposed with leaving the second insulating film at both sides of the first recess; and
providing a conductor in each of the first and second recesses.

11. The method according to claim 10, wherein providing plurality of the first insulating films above the substrate with stacking, and forming the first and second recesses at least one by one respectively in a first insulating film of an uppermost layer of the first insulating films.

12. The method according to claim 10, wherein forming the conductor as a fuse interconnect provided in the second recess.

13. A method of manufacturing a semiconductor device comprising:
providing a first insulating film of an n-th layer (n: 2 or more integers) on a first insulating film of an (n−1)th layer provided above a substrate and being formed with at least one lower-layer conductor;
providing a third insulating film having processing selectivity smaller than that of the first insulating film on the first insulating film of the n-th layer, and forming at least one through hole through the third insulating film along a thickness direction thereof above at least one said lower-layer conductor;
providing a first insulating film of an (n+1)th layer with covering a surface of the third insulating film and a surface of the first insulating film of the n-th layer being exposed via the through hole, and forming at least one first recess having a first width larger than a diameter of the through hole through the first insulating film of the (n+1)th layer along a thickness direction thereof above the through hole, and forming at least one second recess having a second width which is 1/x (x: positive numbers larger than 1) a size of the first width through the first insulating film of the (n+1)th layer along a thickness direction thereof at a position off above the through hole;
providing a second insulating film until its thickness coming up to ½x a size of the first width with covering a surface of the first insulating film of the (n+1)th layer being formed with the first and second recesses, and the surface of the third insulating film and the surface of the first insulating film of the n-th layer being exposed via the first recess;
anisotropically removing the second insulating film provided on the surface of the first insulating film of the (n+1)th layer mainly along a thickness direction thereof until at least the surface of the third insulating film below the first recess is exposed with leaving the second insulating film at both sides of the first recess;

forming at least one third recess through the first insulating film of the n-th layer along a thickness direction thereof below the through hole, which communicates with the first recess via the through hole and exposes a surface of the lower-layer conductor below the through hole; and providing an upper-layer conductor in each of the first, second, and third recesses.

14. The method according to claim 13, wherein providing the first insulating film of the (n+1)th layer as a first insulating film of an uppermost layer above the substrate, and forming the first and second recesses at least one by one respectively in the first insulating film of the uppermost layer.

15. The method according to claim 13, wherein forming the conductor as a fuse interconnect provided in the second recess.

16. A method of manufacturing a semiconductor device comprising:

providing a first insulating film of an n-th layer (n: 2 or more integers) on a first insulating film of an (n−1)th layer provided above a substrate and being formed with at least one lower-layer conductor;

forming at least one first recess having a first width in the first insulating film of the n-th layer above at least one said lower-layer conductor, and forming at least one second recess having a second width which is 1/x (x: positive numbers larger than 1) a size of the first width and having a same depth as the first recess in the first insulating film of the n-th layer at a position different from a part formed the first recess;

providing a second insulating film until its thickness coming up to ½x a size of the first width with covering a surface of the first insulating film of the n-th layer being formed with the first and second recesses;

anisotropically removing the second insulating film provided on the surface of the first insulating film of the n-th layer mainly along a thickness direction thereof until the bottom of the first recess is exposed with leaving the second insulating film at both sides of the first recess;

forming a third recess communicating with a lower part of the first recess and exposing a surface of the lower-layer conductor, which through the resist film and the first insulating film of the n-th layer along the thickness direction thereof above the lower-layer conductor and inside the second insulating film left at the both sides of the first recess, after providing a resist film inside each of the first and second recesses and on the surface of the first insulating film of the n-th layer; and providing an upper-layer conductor in each of the first, second, and third recesses, after removing the resist film on the surface of the first insulating film of the n-th layer being formed with the third recess and each inside of the first and second recesses.

17. The method according to claim 16, wherein providing the first insulating film of the n-th layer as a first insulating film of an uppermost layer above the substrate, and forming the first and second recesses at least one by one respectively in the first insulating film of the uppermost layer.

18. The method according to claim 16, wherein forming the conductor as a fuse interconnect provided in the second recess.

* * * * *